(12) United States Patent
Richthammer et al.

(10) Patent No.: US 9,963,094 B2
(45) Date of Patent: May 8, 2018

(54) WORK MACHINE, IN PARTICULAR DUMP TRUCK OR TRUCK

(71) Applicant: Liebherr-Mining Equipment Colmar SAS, Colmar (FR)

(72) Inventors: Burkhard Richthammer, Freiburg (DE); Kai Kugelstadt, Lahr (FR); Adrien Levaray, Colmar (FR); Bernd Sommer, Biberach/Riss (DE)

(73) Assignee: Liebherr-Mining Equipment Colmar SAS, Colmar (FR)

( * ) Notice: Subject to any disclaimer, the term of this patent is extended or adjusted under 35 U.S.C. 154(b) by 22 days.

(21) Appl. No.: 14/639,940

(22) Filed: Mar. 5, 2015

(65) Prior Publication Data
US 2015/0251611 A1 Sep. 10, 2015

(30) Foreign Application Priority Data
Mar. 6, 2014 (DE) .......................... 10 2014 003 375

(51) Int. Cl.
*B60K 6/405* (2007.10)
*B60R 16/023* (2006.01)
*B60K 6/46* (2007.10)

(52) U.S. Cl.
CPC ............ *B60R 16/0239* (2013.01); *B60K 6/46* (2013.01); *Y10S 903/951* (2013.01)

(58) Field of Classification Search
CPC ........ B60K 6/46; B60R 16/0239; H05K 5/00; H05K 5/0026; H05K 1/0201; H05K 7/1427; H05K 7/1432; H05K 7/1474; H05K 7/20872; Y10S 903/951; B60Y 2304/00; B60Y 2304/074; B60Y 2400/61
See application file for complete search history.

(56) References Cited

U.S. PATENT DOCUMENTS

| | | | | |
|---|---|---|---|---|
| 5,530,323 A * | 6/1996 | Breitzmann | .............. | H02P 5/48 318/41 |
| 6,334,796 B1 * | 1/2002 | Fromme | ................ | H02K 5/225 439/700 |
| 6,898,072 B2 * | 5/2005 | Beihoff | ................... | B60L 11/12 257/692 |
| 7,274,573 B2 * | 9/2007 | Sevakivi | ............. | H05K 7/1432 211/183 |
| 7,950,481 B2 * | 5/2011 | Betz | ......................... | B60K 6/46 180/6.44 |
| 8,155,834 B2 * | 4/2012 | Murahashi | ............. | B60B 11/06 180/339 |

(Continued)

FOREIGN PATENT DOCUMENTS

| WO | 2004047225 A2 | 6/2004 | | |
|---|---|---|---|---|
| WO | WO 2008115169 A1 * | 9/2008 | ............. | B60K 11/02 |
| WO | WO 2012118506 A1 * | 9/2012 | ............. | B60K 6/442 |

*Primary Examiner* — James A Shriver, II
*Assistant Examiner* — Steve Clemmons
(74) *Attorney, Agent, or Firm* — McCoy Russell LLP

(57) ABSTRACT

The present disclosure relates to a work machine, in particular in the form of a dump truck or of a truck, having a diesel electric traction drive, comprising at least one internal combustion engine, at least one alternator, at least one set of power electronics as well as at least one electric motor, wherein the power electronics are divided into two or more functional modules and at least one, each, functional module has an encapsulated housing.

19 Claims, 9 Drawing Sheets

(56) References Cited

U.S. PATENT DOCUMENTS

| | | | | |
|---|---|---|---|---|
| 8,276,694 B2* | 10/2012 | Stervik | ................... | B60K 6/26 180/65.22 |
| 8,324,846 B2* | 12/2012 | Marchand | ................. | B60L 7/16 318/362 |
| 8,391,008 B2* | 3/2013 | Dede | ................... | H01L 23/4735 165/104.21 |
| 8,474,560 B1* | 7/2013 | Konz | ................... | B60R 16/04 180/68.5 |
| 8,562,472 B2* | 10/2013 | Shinohara | ........... | F16H 57/0479 475/159 |
| 8,672,069 B2* | 3/2014 | Cherney | ................. | B60K 6/46 180/24.07 |
| 8,884,451 B2* | 11/2014 | Hatanaka | ............. | B60W 10/08 290/40 C |
| 8,950,526 B2* | 2/2015 | Bullock | ................... | B60K 6/46 180/54.1 |
| 9,108,497 B2* | 8/2015 | Harrison, III | ............ | B60K 1/04 |
| 9,145,065 B2* | 9/2015 | Knoblauch | ......... | B60L 11/1877 |
| 9,540,788 B2* | 1/2017 | Naito | ....................... | B60K 1/00 |
| 2002/0061803 A1* | 5/2002 | Aoki | ........................ | B60K 6/44 477/3 |
| 2004/0134699 A1* | 7/2004 | Shimizu | ................... | B60K 1/04 180/68.5 |
| 2008/0221741 A1 | 9/2008 | Pillar et al. | | |
| 2009/0266632 A1* | 10/2009 | Hill | ......................... | B60K 1/02 180/68.1 |
| 2010/0065356 A1* | 3/2010 | Reddy | ..................... | B60K 1/02 180/65.31 |
| 2011/0079454 A1* | 4/2011 | Maguire | ................ | B60K 6/442 180/65.25 |
| 2013/0194763 A1* | 8/2013 | Yoon | ..................... | B60R 16/0238 361/752 |
| 2013/0294040 A1* | 11/2013 | Fukumasu | .............. | H02M 1/44 361/752 |
| 2016/0229293 A1* | 8/2016 | Seo | .......................... | B60K 6/52 |

* cited by examiner

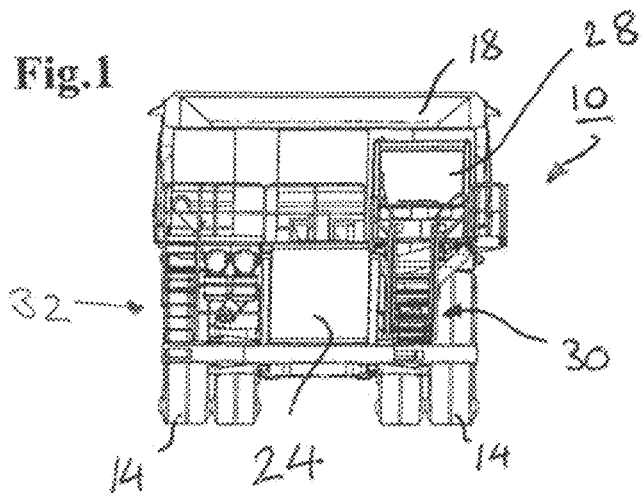
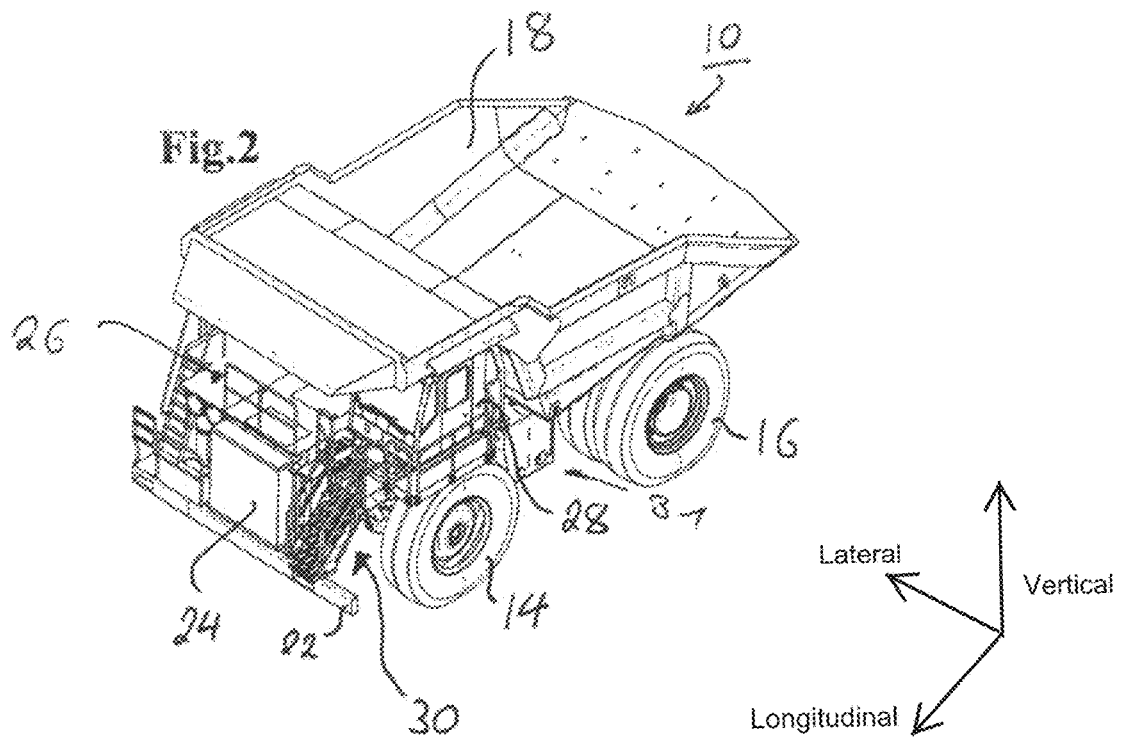

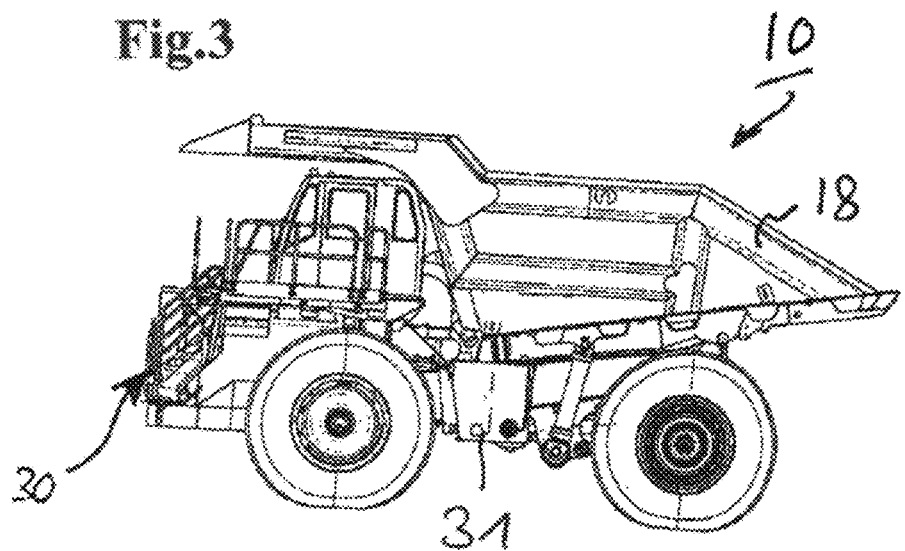
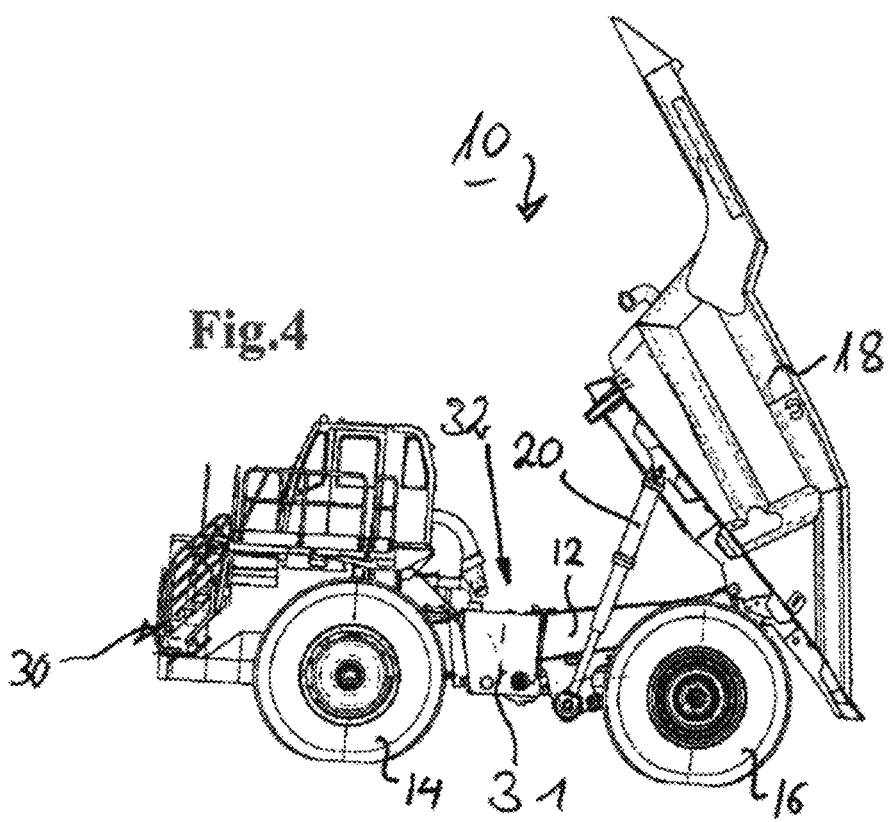

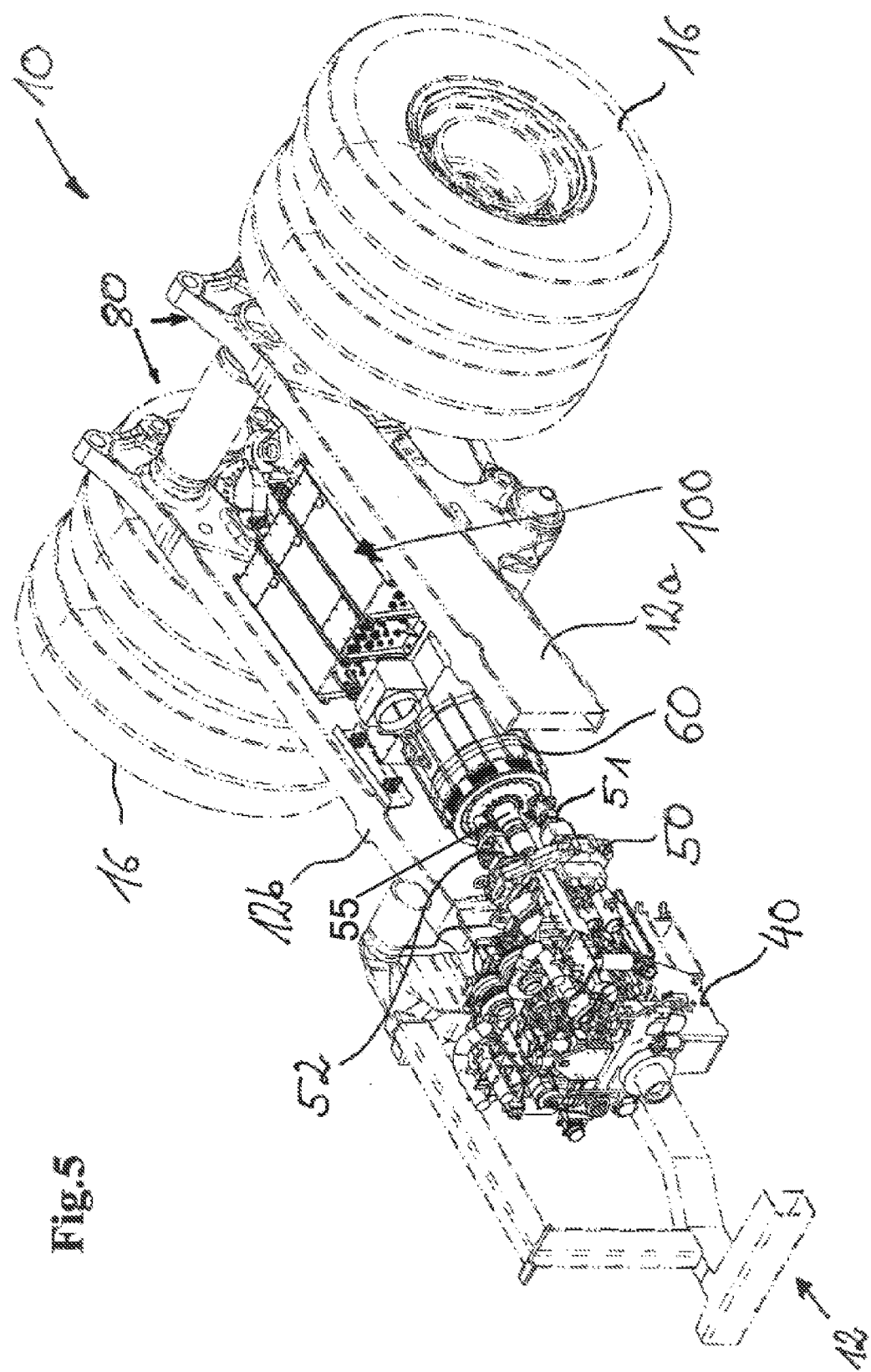

WORK MACHINE, IN PARTICULAR DUMP TRUCK OR TRUCK

CROSS REFERENCE TO RELATED APPLICATION

This application claims priority to German Patent Application No. 10 2014 003 375.9, entitled "Work Machine, In Particular Dump Truck or Truck", filed Mar. 6, 2014, which is hereby incorporated by reference in its entirety for all purposes.

TECHNICAL FIELD

The present disclosure relates to a work machine, in particular in the form of a dump truck or of a truck, having a diesel electric traction drive, comprising at least one internal combustion engine, at least one alternator, at least one set of power electronics as well as at least one electric motor.

BACKGROUND AND SUMMARY

Dump trucks or so-called large dump trucks are predominantly used in coal mining operations or ore mining operations for the transport of the mined coal, minerals and ores. These bulk material dumpers are manufactured in sizes of more than 90 metric tons (t) up to several 100 t in weight and payload so that they have very large dimensions overall.

A diesel electric drive is used as the traction drive, wherein the mechanical energy generated by a diesel engine is converted with the aid of an alternator into electrical energy for the supply of the electric traction drives. The reason for this process is that diesel engines, like all internal combustion engines, can only be operated with ideal efficiency in a very restricted speed range and cannot be started under load. The AC motors for the driving axle can also produce the desired torque in the lower speed range for starting. The internal combustion engine used can be operated continuously in the ideal speed range.

Corresponding power electronics are required for the control of the one or more electric motors and of the alternator. They as a rule include one or more frequency converters to regulate the required speed at the electric motors. The total power electronics were previously integrated into a common switch cabinet which was arranged on the upper deck of the dump truck in the region of the operator's cabin.

Due to the position and due to the huge dimensions of such dump trucks, an enormous effort has to be applied for the installation or dismantling of the switch cabinet since it can only be accessed with difficulty at a great height on the upper deck. Minor servicing work still has to be carried out by a correspondingly trained technician since there is a risk to life and limb for persons due to the high electrical powers. The switch cabinet can be opened for servicing work and the power electronics can be serviced or repaired on site.

However, it cannot always be ensured that a correspondingly trained technician is available at the deployment site for the repair and servicing of the power electronics. However, a complete replacement of the power electronics is not wanted or is not possible due to the described effort.

The present disclosure has for this reason set itself the object of finding a suitable solution for the design and the integration of the power electronics of a diesel electric drive of a work machine of the present category.

This object is achieved by a work machine, in particular in the form of a dump truck or of a truck, having a diesel electric drive, it is now proposed not to accommodate the power electronics in a common switch cabinet, but instead a modular concept is proposed according to which individual components of the power electronics are divided into individual modules by function, in particular into at least two or more modules, and at least one of the modules is accommodated on its own in an encapsulated housing. Ideally, all functional modules are accommodated in their own encapsulated housings. The individually encapsulated housings can be installed and disassembled individually. The work machine may include various of the features of work machines described herein, such as an upper deck, an operator cabin, etc., positioned as described above herein.

This approach offers the advantage that individual modules can be replaced more simply and in the event of a defect can be replaced in an uncomplicated manner with a new corresponding module on site at the deployment location. The power electronics, for example, no longer have to be repaired on site, but defective modules can be replaced. This is in particular sensible when no trained technician is available at the respective deployment site.

The replacement of individual functional modules is substantially simpler and more effective with respect to a conventional switch cabinet due to the smaller dimensions.

It is, for example, conceivable that the individual encapsulated housings do not provide any access in the form of a servicing flap, servicing door, etc. and are thus only suitable for on-site replacement, but not for on-site repair.

The encapsulated housing is produced from a solid material, metal, particularly from steel, stainless steel, aluminum or from a combination of the named material types. The integral power electronics can be protected from external influences such as moisture, stone chipping, dust, etc. by the solid material.

The division of the power electronics into individual functional modules can in particular take place such that individual electronic components are divided in dependence on the associated electrical consumers, i.e. on the electric motors. The required frequency converters for a first electric motor are, for example, integrated in a functional module, while the frequency converters for a second electric motor are integrated in a further functional module.

There is furthermore the possibility of providing at least one separate functional module for the required control electronics for controlling and/or regulating the alternator and/or the frequency converters of the further functional modules.

The encapsulated housings comprise one or more external electrical terminals for the cabling to the alternator, on the one hand, and for the cabling to one or more electric motors, on the other hand. The external terminals likewise serve the mutual coupling of the functional modules.

In addition to the electrical terminals, connections for an integrated cooling can be provided. External connections for the supply or removal of a corresponding cooling medium for the integrated cooling in at least one of the functional modules are conceivable. Each functional module ideally has its own integrated cooling with its own connections.

In a particularly preferred embodiment of the present disclosure, at least one receiving means is provided, in the form of a board or of another platform. The design in the form of a frame is also conceivable. The receiving means is suitable for a common receiving of two or more functional modules of the power electronics.

The housings of the individual functional modules are ideally configured in box shape so that they can be stacked on one another or can be arranged in rows next to one another in a space-saving manner. Two or more functional modules can be mounted above the receiving means at the work machine, in particular at the vehicle frame of the work machine. Additional protection from dust or stones swirled up from below results by using a platform as the receiving means for the individual functional modules. There is moreover the possibility of designing the receiving means as releasable to be able to disassemble the receiving means with the received functional modules together.

The functional modules can, for example, be assembled together in the region of the driven rear wheel axle of the work machine so that there are line paths which are as short as possible between the functional modules and the electric motors to be supplied. An arrangement of at least one power module or of all power modules between the alternator and the electric motors is particularly preferred. It is also conceivable to arrange some of the functional modules in the vehicle frame between the two longitudinal beams of the vehicle frame, while some others of the power modules are fastened to the outer side of the frame beams. There is moreover the possibility of assembling all functional modules at the outside to the frame rack, in particular at the left and/or right in the direction of travel.

In addition to the work machine in accordance with the present disclosure, the present disclosure relates to power electronics for the work machine in accordance with the present disclosure. The power electronics comprise two or more functional modules, with each functional module being accommodated in an encapsulated housing. The advantages and properties of the power electronics in accordance with the present disclosure obviously correspond to those of the work machine in accordance with the present disclosure so that a repeat description will be dispensed with at this point.

The present disclosure further relates to a diesel electric drive train having power electronics in accordance with the present disclosure. The same advantages and properties also apply with respect to the diesel electric drive train which have already been discussed and described in detail above. A repeat description is therefore dispensed with.

Further advantages and properties of the present disclosure will be explained in more detail in the following with reference to an embodiment shown in the Figures. There are shown:

BRIEF DESCRIPTION OF THE FIGURES

FIGS. 1-4 show a plurality of representations of the dump truck in accordance with the present disclosure.

FIG. 5 shows a perspective detailed view of the drive train of the dump truck in accordance with the present disclosure.

DETAILED DESCRIPTION

Figure 6:
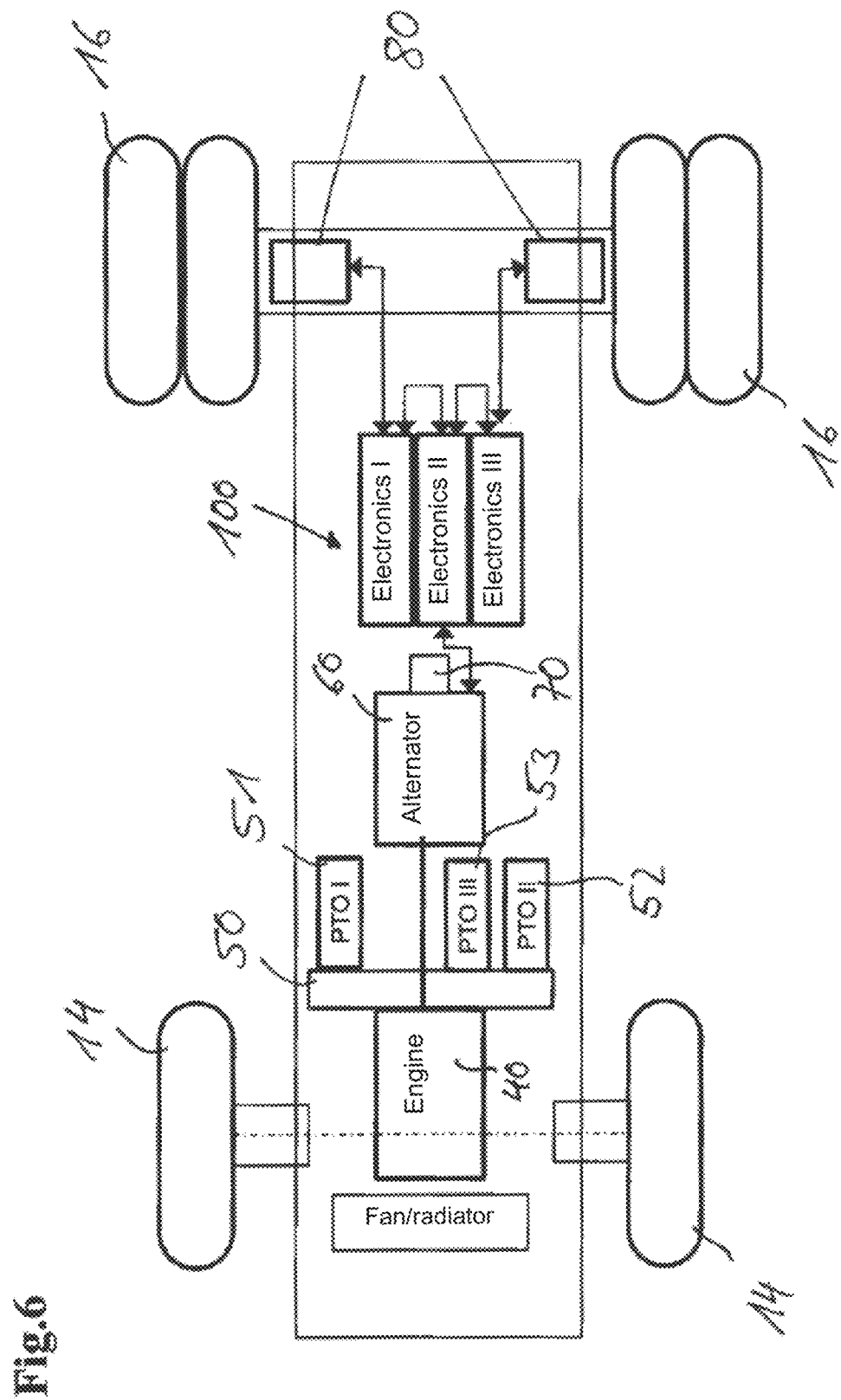
FIGS. 6-8 show schematic representations of the drive train in accordance with the present disclosure in accordance with different embodiments.

A dump truck 10 is shown in FIGS. 1 to 4. It is here a so-called large dump truck such as is used in ore mines. Front wheels 14 and rear wheels 16, driven via electric motors not shown in more detail, are supported at a rigid frame 12. The rear wheels 16 are designed with dual tires.

A skip 18 is pivotally connected to the frame 12 and is pivotable via hydraulic lifting cylinders 20 provided at both sides at the vehicle. The vehicle 10 is bounded by the bumper 22 in the region of the vehicle 10 at the front in the direction of travel. A radiator module 24 is arranged above the bumper 22. An upper deck 26 in turn extends over the width of the dump truck 10 above the radiator module 24. An operator's cabin 28 is arranged at a side of the upper deck 26. In the embodiment shown here, the operator's cabin 28 is positioned at the side of the upper deck 26 at the left in the direction of travel. The operator's cabin 28 thus lies above the front left wheel 14.

The dump truck 10 comprises a diesel electric drive which is easily recognizable in the perspective detailed view of the vehicle frame 12 in FIG. 5. The drive comprises the diesel engine 40 which is mounted at the vehicle frame 12 in the front region viewed in the direction of travel. The internal combustion engine 40 is in particular seated in the region of the front axle 14 beneath the upper deck 26 and the operator's cabin 28. The required fuel tank is received between the front wheel axle and the back wheel axle 14, 16 at the frame 12 at the left vehicle side in the direction of travel.

The internal combustion engine 40 drives the alternator 60 mechanically to generate the required electrical energy for the electrical traction drive. Two AC motors 80, which are integrated to the left and right in the rear wheel axle 16, serve as the traction drive. The use of separate motors per vehicle side of the rear axle 16 optimizes the cornering and maneuvering since different speeds can be selected for the driven wheels. Power electronics 100 with the required power components such as frequency converters, etc. are available for the control or regulation of the electric motors 80 and of the alternator 60.

Numerous secondary consumers of the dump truck are no longer driven electrically by the generated energy of the alternator 60, but are instead hydraulically supplied. Secondary consumers are, for example, the hydraulic lifting cylinders 20, the drive steering of the dump truck 10, which is likewise hydraulically implemented, and one or more hydraulic fan motors for cooling the electric motors 80, the power electronics 100, the alternator 60 and any other components.

The required hydraulic oil for the secondary consumers is provided by the hydraulic tank 32 which is positioned at the side of the vehicle 10 disposed opposite the fuel tank 31.

In accordance with the detailed view of FIG. 5, the vehicle frame 12 comprises the two longitudinal frame beams 12a, 12b extending in parallel at whose center the total vehicle drive train is supported. In the embodiment shown, a pump transfer case 50 is mounted directly at the engine 40 at the rear in the region of the motor shaft. The transfer case comprises a continuous shaft which is connected at the output side via the Cardan shaft 55 to the alternator 60. The output power is thereby transferred to the alternator 60 almost without loss.

The transfer case 50 furthermore provides a plurality of power takeoffs (PTOs) 51, 52 via which a small portion of the engine output power is branched off and is used for the drive of the secondary consumers. In the embodiment variant of FIG. 5 shown, it has proved to be advantageous that the Cardan shaft 55 only serves the provision of the required torque to the alternator 60. The load of the transfer case 50 does not contact the Cardan shaft 55.

The power of the internal combustion engine 40, in particular in the high-power engines for dump trucks, causes high vibrations which can be transmitted to the alternator 60 via the Cardan shaft 55. As a result of the design, the alternator 60 is prone to any vibrations so that an additional clutch is integrated between the alternator 60 and the diesel engine 40. A clutch having an integrated torsion vibration damper is in particular directly integrated into the transfer case 50.

The shown embodiment of FIG. 5 creates additional construction space at the end of the alternator so that a resolver/rotary encoder 70 has space between the power electronics 100 and the alternator 60 (cf. FIG. 6). The available construction space allows the use of conventional resolvers 70 which can be installed without any complex/expensive new design or modification. Additional development costs and productions costs can thereby be saved.

The assembly of the drive components 40, 50, 60 at the frame linkage takes place by means of fastening clamps. In the representation in accordance with FIG. 5, the fastening means of the internal combustion engine 40 additionally have to support the weight of the transfer case 50. The fastening means of the alternator 60 are welded laterally to fasten the alternator 60 to the longitudinal beams 12a, 12b in the region between them.

For clarity, the embodiment in accordance with FIG. 5 is shown again schematically in FIG. 6. The transfer case 50 comprises a third power takeoff 53 in addition to the power takeoffs 51, 52 visible in FIG. 5. A hydraulic pump for the provision of the required hydraulic pressure for operating the lifting cylinder 20 is driven for example via the first power takeoff 51. The second power takeoff 52 drives the pump for the hydraulic steering, whereas a further hydraulic pump is coupled to the third power takeover 53 for exerting pressure on one or more hydraulic fan motors or other hydraulic consumers. The representations of FIGS. 5 and 6 admittedly show a total of three power takeoffs, but embodiments having fewer or more power takeoffs are conceivable as long as the required alternator power can be provided. The individual hydraulic pumps are connected to the power takeoffs 51, 52, 53 via spur wheel sections.

It should be appreciated the FIGS. 1-5 are each drawn approximately to scale indicating relative dimensions and positioning of components with respect to each other. Further, components depicted as directly coupled without other components therebetween may be so-coupled in one example. Further, the lack of components or elements in the figures can, in one example, indicate that no such components are positioned in such spaces. Additionally, components connected only with each other may be so connected in one example, without additional conditions, whereas elements not coupled to each other may be so configured, in one example. Further, the figures illustrate the vehicle with respect to vertical where the vehicle is on a flat surface, where the longitudinal axis passes perpendicular to vertical along a back to front direction of the vehicle, and perpendicular to lateral along a side to side direction of the vehicle. Further, the figures depict various example regions as described.

Figure 8:
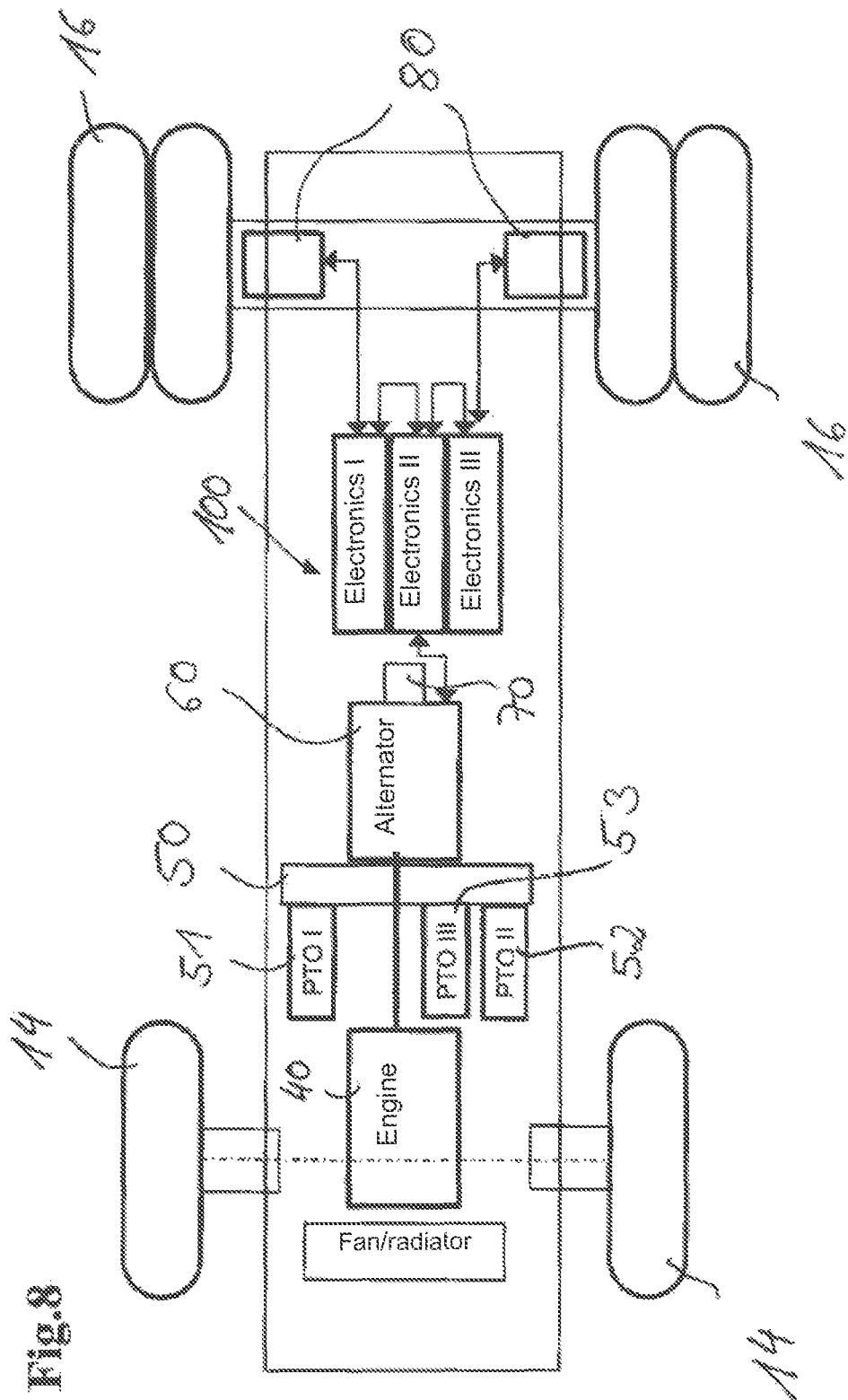

Alternatively to the embodiment of FIGS. 5 and 6, the transfer case 50 can also be arranged directly at the alternator 60 as can be seen from FIG. 8, with the assembly then taking place in mirror-inverted manner to the FIGS. 5 and 6 at the input of the alternator. The connection between the engine output shaft and the transfer case is achieved via the additional Cardan shaft 55. In this respect, the Cardan shaft 55 has to provide the total required power for the drive of the alternator 60 and of the transfer case 50. The alternative embodiment has the advantage that the internal combustion engine 40 can be changed more simply since only an end coupling of the Cardan shaft 55 is necessary for the dismantling. In addition, the required fastening means of the internal combustion engine do not have to support the additional weight of the transfer case 40 at the frame 12 of the dump truck 10. An additional support of the alternator can furthermore take place via the transfer case 40.

Figure 7:
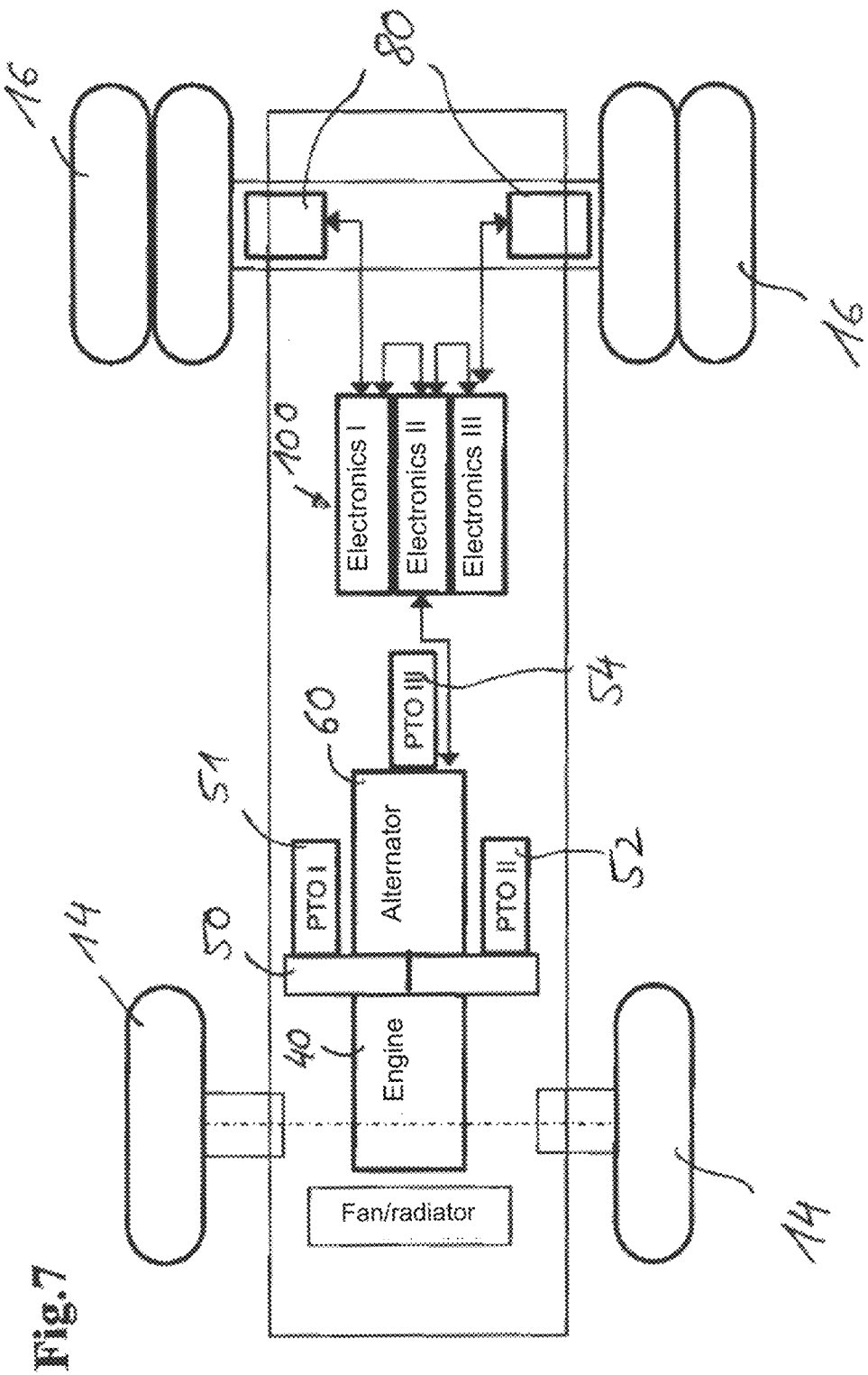

A further alternative embodiment can be seen from FIG. 7, in accordance with which the pump transfer case 50 is directly connected to the internal combustion engine 40 and the alternator 60. An additional Cardan shaft can be led through the alternator 60 as required to allow the coupling of a further power takeoff 54 at the output of the alternator 60.

In the known solutions from the prior art, the power electronics for a diesel electric drive of a dump truck were positioned in a large switch cabinet on the upper deck next to the operator's cabin. However, due to the high electrical power generated, a high potential danger for the operating personnel emanates from the power electronics. The switch cabinet with integrated power electronics may therefore only be operated or opened and serviced by especially trained technicians.

Due to the enormous dimensions of the dump truck 10, very long line paths have to be accepted by the previous arrangement of the switch cabinet on the upper deck for the electrical connection of the power electronics to the alternator, on the one hand, and the electric motors integrated in the rear axle, on the other hand. The required cable harness consequently first has to be conducted from the alternator in the vehicle frame for several meters upwardly up to the upper deck of the vehicle and has to be laid from there back into the vehicle frame to the rear driven rear axle.

Long supply paths, however, increase the effort for the cabling. The huge line length furthermore promotes the likelihood of electromagnetic interference, in particular between the power lines and the signal lines for transmitting the control signals to the alternator and to the electric motor.

The design of the dump truck 10 now differs from the previous solutions known from the prior art and instead proposes not positioning the power electronics 100 on the upper deck 26, but rather as close as possible in the region of the diesel electric drive train such as in the region of the driven rear axle 16 in direct proximity to the electric motors 80 and/or to the alternator 60, for example wholly within tops and bottoms of respective wheels in a vertical direction. A possible installation position of the power electronics 100 is shown in FIG. 5. A much lower spacing from the alternator 60 and from the electric motors 80 in the driven rear axle 16 results by the integration of the power electronics 100 in the vehicle frame 12. Comparatively short line paths and signal paths are thereby achieved, unwanted crosstalk between the lines is minimized and interfering influences on the control signals are thus reduced. The total cabling of the diesel electric drive is further much simpler in design than with the solutions shown in the prior art.

Figure 9:
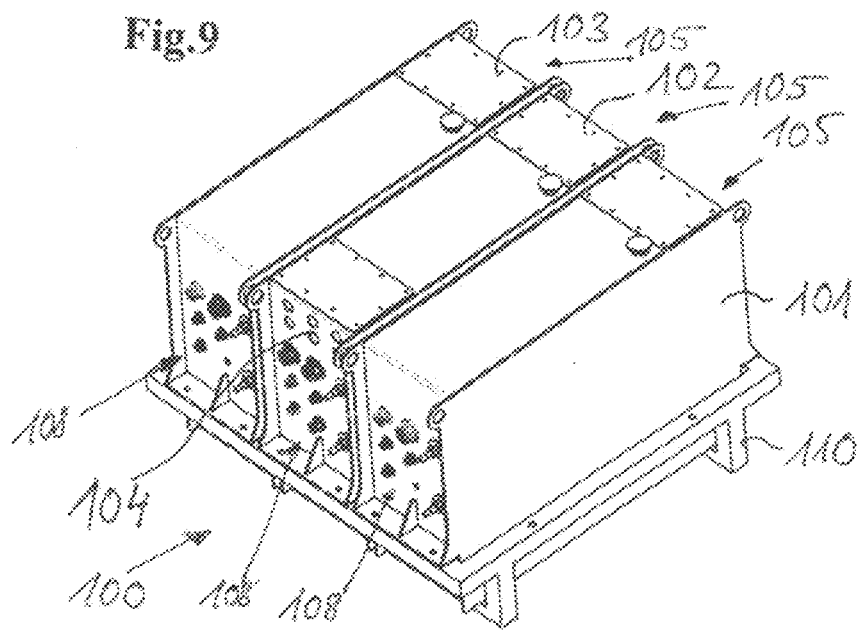
FIG. 9 shows a detailed view of the power electronics in accordance with the present disclosure.

The total power electronics 100 are furthermore not accommodated in a common housing (switch cabinet), but instead have a modular design in accordance with the present disclosure. In accordance with the exemplary representation of FIG. 9, the power electronics 100 are composed of a total of three separate functional modules 101, 102, 103 which are each accommodated in their own encapsulated housings. The housing is produced completely of metal, in particular of steel, stainless steel or aluminum. FIG. 9 shows the box-like functional modules 101, 102, 103 next to one another in a row on a receiving frame 110. The encapsulated housings are prepared in a solid construction and thus offer protection from external influences such as water, dust and stone-chipping.

There is alternatively or additionally the possibility of positioning the functional modules in a row on a fastening platform, in particular a horizontal platform, so that additional protection from stone-chipping results.

The power electronics or the individual functional modules 101, 102, 103 are mounted in the region of the driven rear axle 16 between the two longitudinal beams 12a, 12b of the vehicle frame 12, i.e. are fastened to the longitudinal beams 12a, 12b with the aid of the used fastening frame 110. The front and rear sides of the individual functional modules 101, 102, 103, i.e. the sides of the box shape facing the alternator 60 and the electric motors 80, comprise a plurality of electrical terminals 104, 105 for a mutual electric coupling of the functional modules 101, 102, 103 and for connecting the alternator 60 and the electric motors 80.

The middle functional module 102, for example, comprises all the required control components for the control/regulation of the alternator 60. The alternator 60 is therefore coupled to the power electronics via the terminals 104 on the front side of the functional module 102. The functional modules 101, 103 in contrast comprise the required frequency converters for the feed of the electric motors 80, with a respective functional module 101, 103 being assigned to exactly one electric motor 80. The connections between the functional modules 101, 102, 103 are then established via the available terminals 105 on the rear side of the functional modules 101, 102, 103, i.e. the side facing the electric motors 80. The connection with the motors 80 is likewise achieved via the terminals 105. The cabling is not shown in FIG. 5, but is schematically indicated in FIGS. 6 to 8.

In addition to the electric terminals 104, 105, external terminals 108 for an integrated liquid-based cooling of the power modules are available on the front side. Each encapsulated housing of the functional modules 101, 102, 103 consequently comprises its own integrated cooling.

The representation of FIG. 5 shows a common arrangement of the available functional modules 101, 102, 103 of the power electronics 100 between the longitudinal beams 12a, 12b of the vehicle frame 12. This arrangement corresponds to the schematic representation in accordance with FIG. 11A which shows the vehicle frame 12 in a plan view.

Figure 11A:
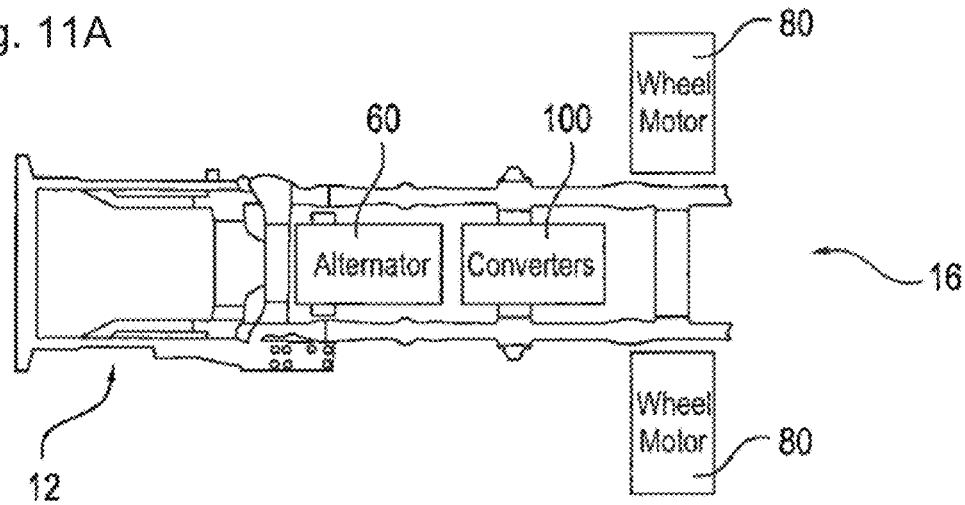
FIGS. 11A-11C show different schematic representations of the vehicle frame with different installation positions of the power electronics.
Figure 11B:
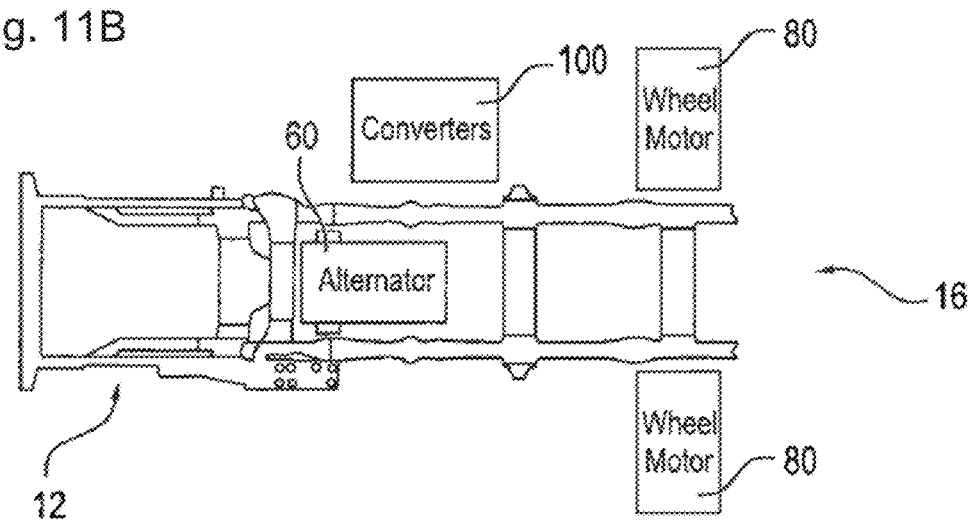

An alternative arrangement can be seen from FIG. 11B, according to which the power electronics 100 is no longer mounted between the beams 12a, 12b, but rather to the right outside the vehicle beam 12b in the direction of travel. A mounting of the total power electronics 100 on the side to the left viewed in the direction of travel, i.e. at the vehicle beam 12a, is naturally also conceivable.

Figure 11C:
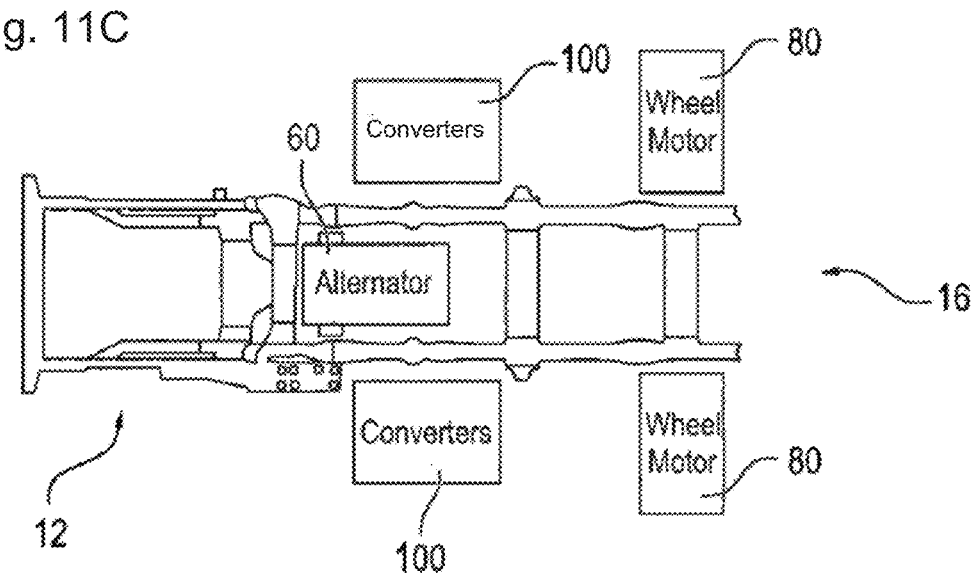

FIG. 11C shows a further possibility, according to which individual functional modules of the power electronics 100 are mounted to the left and right next to the longitudinal beams 12a, 12b. For example, a spread of the functional modules 101, 102, 103 over different mounting positions at the frame is possible in order, for example, to reduce the distance between the functional modules 101, 103 responsible for the electric motors and the respective electric motors 80 as much as possible.

In addition to the shown embodiments of FIGS. 11A to 11C, an arrangement is naturally also conceivable in which some of the power electronics 100 is fastened between the beams 12a, 12b of the vehicle frame 12, whereas a further portion is mounted at the outside.

Figure 10:
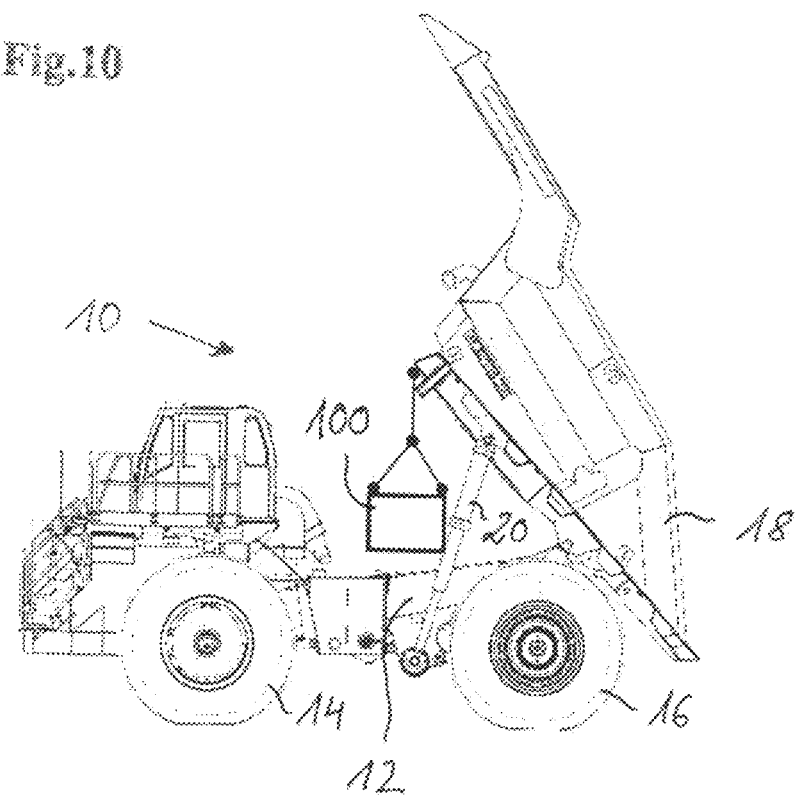
FIG. 10 shows a side view of the dump truck with lifting gear.

FIG. 10 now shows a further advantage of the solution presented. In addition to the already shown technical advantages, a better access for service work, assembly work and dismantling work at the power electronics 100 results due to the installation location close to the ground. Only the skip 18 has to be placed upright 18 for the service access to the power electronics (FIG. 10). For the service work, the skip 18 can additionally be secured so that the skip also remains upright with disconnected electrics, for example due to a mechanical tension connection between the skip end and the transport frame.

The required modules 101, 102, 103 can be removed either individually or in common and no longer have to be moved the long distance from or to the upper deck 26 of the dump truck. It is in addition intended that on a defect of the power electronics, individual modules 101, 102, 103 can be directly replaced and do not have to be repaired on site. Especially trained technicians on site can be dispensed with and the down time of the machine 10 due to a defect can be minimized.

Alternatively, as shown in FIG. 10, at least one lifting gear can be fastened to the lower edge of the skip 18 to be able to take up the power electronics 100 or individual functional modules 101, 102, 103 for assembly/dismantling. The lifting gear used ideally allows, in addition to the vertical lifting movement, a horizontal movement for moving the load taken up.

It is additionally pointed out that the advantageous arrangements of the power electronics 100 at the vehicle frame 12 (FIGS. 11A-11C) not only apply to a modular design of the power electronics, but also to a conventional design in a single housing. A modular-like design of the power electronics is equally conceivable if they are mounted on the upper deck 26 or elsewhere at the vehicle 10.

Figure 12:
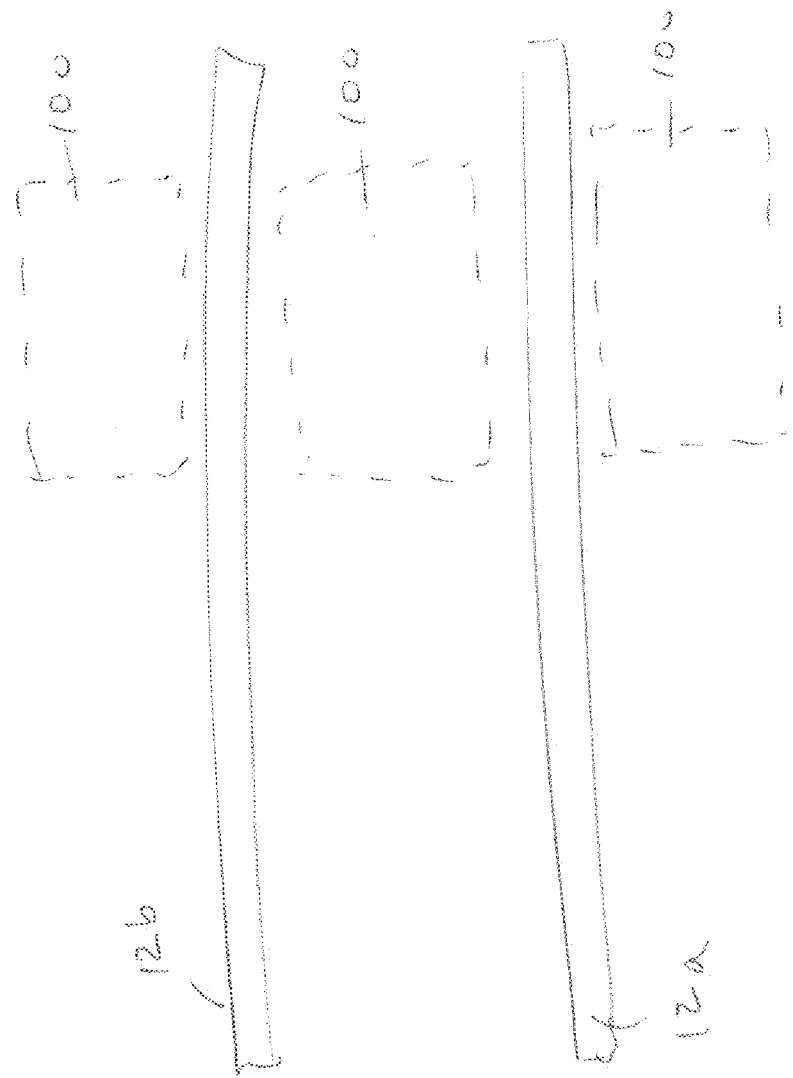
FIG. 12 shows an example of the vehicle frame rails 12a, 12b from vertically above, with various locations.

FIG. 12 shows an example of the vehicle frame rails 12a,b from vertically above, with various locations for example power electronics 100. The power electronics 100 may be mounted to one side of the rails, between the rails, and/or to the other side of the rails. For example, in one example, two housings of power electronics 100 are each mounted at an outside at the vehicle frame.

In one example embodiment, a system, comprises a work machine having a diesel electric fraction drive including at least one internal combustion engine, at least one alternator, at least one set of power electronics as well as at least one electric motor, wherein the motor is coupled to a driving axle driving a wheel of the work machine, and wherein the power electronics are arranged adjacent the driving axle of the work machine between parallel frame rails of the work machine. The engine may be longitudinally mounted in the work machine forward of the driving axle, the work machine further having an upper walking deck positioned vertically above the frame rails, the rails each formed as longitudinal beams coupled together to one another. The power electronics may be housed by at least one housing the housing fully between the two rails, where the housing does not extend vertically above a top of the rails along an entire longitudinal length of the housing. The work machine may further include an operator cab, a skip, and/or a radiator module. The radiator module may be positioned at a front of the work machine without any other components forward of the radiator module, the radiator module coupled below the upper deck. At least two power electronics housings may be provided adjacent one another, and where outside side walls of the housings are each adjacent and in face-sharing contact with inner side walls of the respective side rails. The power electronics may be divided into two or more functional modules and at least one of the functional modules has an encapsulated housing. The housing material may at least partially comprise metal. The encapsulated housing may comprises one or more external terminals coupled with electrical cabling to the alternator and/or to further functional modules and/or to one or more electrical traction drives, and wherein the functional modules at least partially comprise an integrated cooling with external terminals on an outer housing side, wherein the electronic components of the power electronics are divided into different functional modules, and wherein frequency converters for each electric motor are accommodated in separate functional modules. At least one functional module may comprise an alternator control or alternator regulator and/or the control/regulator of frequency converters for the electric motors, and wherein a receiving board or frame, is provided for receiving two or more or all functional modules of the power electronics, and wherein the receiving board or frame is releasably connectable to the a vehicle frame of the work machine. At least some of the functional modules or all the functional modules may be mounted between the alternator and the electric motor, in between rails of a vehicle frame.

The invention claimed is:

1. A work machine, having a diesel electric traction drive, comprising at least one internal combustion engine, at least one alternator, at least one set of power electronics having a modular design, as well as at least one electric motor integrated in and coupled to a rear driving axle driving a rear wheel of the work machine, the engine longitudinally mounted in the work machine forward of the rear driving axle,
wherein the power electronics are divided into two or more functional modules, wherein each functional module is accommodated in its own individual encapsulated housing, wherein the encapsulated housings of the functional modules are each configured to be installed and disassembled individually, wherein the work machine comprises parallel longitudinal frame rails, and wherein the two or more functional modules comprise a first functional module fastened to an outer side of one of the frame rails, a second functional module arranged between the frame rails and adjacent to the rear driving axle, and a third functional module fastened to an outer side of the other frame rail.

2. The work machine of claim 1, wherein the work machine is in the form of a dump truck or of a truck.

3. The work machine in accordance with claim 1, wherein the housing material at least partially comprises metal.

4. The work machine of claim 3, wherein the housing material includes steel and/or stainless steel and/or aluminum.

5. The work machine in accordance with claim 1, wherein the encapsulated housing comprises one or more external terminals coupled with electrical cabling to the alternator and/or to further functional modules and/or to one or more electrical traction drives.

6. The work machine in accordance with claim 5, wherein frequency converters for each electric motor are accommodated in separate functional modules.

7. The work machine in accordance with claim 1, wherein the functional modules at least partially comprise an integrated cooling with external terminals on an outer housing side.

8. The work machine in accordance with claim 1, wherein electronic components of the power electronics are divided into different functional modules.

9. The work machine in accordance with claim 1, wherein at least one functional module comprises an alternator control or alternator regulator and/or a control/regulator of frequency converters for the electric motors.

10. The work machine in accordance with claim 1, wherein a receiving board or frame is provided for receiving two or more or all of the functional modules of the power electronics.

11. The work machine in accordance with claim 10, wherein the receiving board or frame is releasably connectable to a vehicle frame of the work machine, the vehicle frame comprising the frame rails.

12. The work machine in accordance with claim 1, wherein at least some of the functional modules or all of the functional modules are mounted between the alternator and the electric motor.

13. A system, comprising:
a work machine having a diesel electric traction drive including at least one internal combustion engine, at least one alternator, at least one set of power electronics having a modular design, as well as at least one electric motor integrated in and coupled to a rear driving axle driving a rear wheel of the work machine, the engine longitudinally mounted in the work machine forward of the rear driving axle, wherein the power electronics are arranged adjacent the rear driving axle of the work machine between parallel longitudinal frame rails of the work machine and longitudinally rearward of an output shaft of the engine, wherein the power electronics are divided into two or more functional modules, wherein each functional module is accommodated in its own individual encapsulated housing, and wherein the encapsulated housings of the functional modules are each configured to be installed and disassembled individually.

14. The work machine in accordance with claim 13, wherein the housing material at least partially comprises metal.

15. The work machine in accordance with claim 14, wherein the encapsulated housing of each functional module comprises one or more external terminals coupled with electrical cabling to the alternator and/or to further functional modules and/or to one or more electrical traction drives, and wherein the functional modules at least partially comprise an integrated cooling with external terminals on an outer housing side, wherein electronic components of the power electronics are divided into different functional modules, and wherein frequency converters for each electric motor are accommodated in separate functional modules.

16. The work machine in accordance with claim 14, wherein at least one functional module comprises an alternator control or alternator regulator and/or a control/regulator of frequency converters for the electric motors, and wherein a receiving board or frame is provided for receiving two or more or all of the functional modules of the power electronics, and wherein the receiving board or frame is releasably connectable to a vehicle frame of the work machine, the vehicle frame comprising the frame rails.

17. The work machine in accordance with claim 16, wherein at least some of the functional modules or all of the functional modules are mounted between the alternator and the electric motor, in between the frame rails.

18. The system of claim 17, wherein the work machine further comprises an upper walking deck positioned vertically above the frame rails, the frame rails each formed as longitudinal beams coupled together to one another, and where each housing does not extend vertically above a top of the frame rails along an entire longitudinal length of that housing.

19. The system of claim 18, wherein at least two of the power electronics housings are provided adjacent one another, wherein an outside wall of one of the power electronics housings is adjacent to an inner wall of one of the frame rails, and wherein an outside wall of another one of the power electronics housings is adjacent to an inner side wall of the other frame rail.

* * * * *